United States Patent
Taylor, Jr. et al.

(10) Patent No.: US 6,849,487 B2
(45) Date of Patent: Feb. 1, 2005

(54) METHOD FOR FORMING AN ELECTRONIC STRUCTURE USING ETCH

(75) Inventors: William J. Taylor, Jr., Round Rock, TX (US); Olubunmi O. Adetutu, Austin, TX (US); Steven G. H. Anderson, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 270 days.

(21) Appl. No.: 10/445,791

(22) Filed: May 27, 2003

(65) Prior Publication Data

US 2004/0253799 A1 Dec. 16, 2004

(51) Int. Cl.$^7$ .................. H01L 21/336; H01L 21/3205; H01L 21/44
(52) U.S. Cl. ............... 438/197; 438/305; 438/585; 438/592; 438/596; 438/655; 438/683; 438/947
(58) Field of Search .................. 438/585, 592, 438/595, 596, 657, 947

(56) References Cited

U.S. PATENT DOCUMENTS

| | | | | |
|---|---|---|---|---|
| 4,716,131 A | * | 12/1987 | Okazawa et al. | 438/586 |
| 5,753,546 A | * | 5/1998 | Koh et al. | 438/229 |
| 5,937,319 A | * | 8/1999 | Xiang et al. | 438/585 |
| 6,060,377 A | * | 5/2000 | Xiang et al. | 438/585 |
| 6,133,129 A | * | 10/2000 | Xiang et al. | 438/585 |
| 6,177,684 B1 | | 1/2001 | Sugiyama | |
| 6,204,130 B1 | * | 3/2001 | Gardner et al. | 438/287 |
| 6,281,086 B1 | * | 8/2001 | Wieczorek et al. | 438/305 |
| 6,413,802 B1 | | 7/2002 | Hu et al. | |
| 6,603,180 B1 | * | 8/2003 | Gardner et al. | 257/382 |

* cited by examiner

*Primary Examiner*—John F. Niebling
*Assistant Examiner*—Ron Pompey

(57) ABSTRACT

A method of forming a conductive structure having a length that is less than the length define by photolithographic patterning. A silicon layer (12) is formed in a MeOx dielectric layer (11) is photolithographically patterned to a predetermined first length. A metal layer (31) is formed conformally to at least the sidewalls of the silicon layer and then is reacted with the silicon to form a metal silicide (41). In particular, metal silicide abutments (411,412) are formed contiguous to sidewalls (421,422) of a reduced conductor (42). The remaining metal layer and the metal silicide are etched away, resulting in a conductor having predetermined second length that is less than the predetermined first length.

24 Claims, 3 Drawing Sheets

METHOD FOR FORMING AN ELECTRONIC STRUCTURE USING ETCH

FIELD OF THE INVENTION

The invention relates generally to the design and fabrication of semiconductor devices and, more particularly, to a method of forming a reduced-dimension structure, such as a reduced gate length in a MOS transistor.

BACKGROUND OF THE INVENTION

There exists a persistent incentive in the semiconductor industry to fabricate integrated circuit (IC) devices of increasing complexity. As is well known, increased complexity of an IC product results in fabrication costs that increase commensurately. In order to provide IC devices having enhanced functional capability, while appropriately managing the cost associated with device fabrication, the number of devices included on each semiconductor wafer must be continually increased. In recent years, developments in IC fabrication technology have enabled the ability to define circuit components having feature sizes in the sub-micron range. For example, new lithographic techniques have been developed using x-ray and deep UV energy sources. In addition, film deposition technology now exists that forms thin films having a precisely determined metallurgical composition and thickness. Furthermore, thin-film etching techniques have been developed that are capable of selectively etching a specified metallurgical composition, while preserving in tact other metallurgical compositions present on. the semiconductor substrate.

However, notwithstanding the marked advances in semiconductor fabrication technology, realization of the necessary device density and cost control in the manufacture of contemporary IC products require further processing innovations. As device dimensions, such as the gate length of metal oxide semiconductor (MOS) transistors, continue to be compacted, additional physical process limitations come into play.

A significant impediment to further size reduction of MOS transistors derives directly from the physical limitation of lithographic technology. Photolithographic techniques utilize an optically sensitive resist material that is formed on a semiconductor substrate. A photolithographic mask having a predetermined pattern is aligned to the semiconductor wafer, and light is passed through the mask. After exposing the resist, the resist is developed and selectively etched away to form a pattern on the wafer. Photoresist exposure steps typically require precision alignment of the mask with the wafer. The minimum feature size that can be photolithographically defined is constrained not only by limitations that inhere in alignment precision, but also by optical diffraction. To reduce the effects of diffraction in lithographic operations, state-of-the-art processes have resorted to the use of deep UV lithographic techniques, recognizing that diffraction anomalies vary inversely with the frequency of the optical energy source. However, even deep UV lithography is not able to reliably define feature sizes below approximately 100 nanometers (nm).

Consequently, the fabrication of MOS transistors with gate structures on the order of 100 nm requires processing technology beyond existing lithographic and resist formulation technologies. In many ways, the smallest feature size to which an MOS gate electrode may be fabricated dictates the scaling of all other device components in an IC device. The feature size of a MOS gate electrode must be continuously reduced in order to improve the performance and operational capabilities. Accordingly, a sophisticated fabrication process is necessary to reliably manufacture device components, such as MOS transistors, having gate lengths on the order of 100 nm or less.

To further enhance the performance of lithographic technology, manufacturers have developed advanced resist materials and coatings, such as antireflective coatings (ARCs) and the like, that improve the ability of optical lithography to produce submicron features. Additionally, post-feature-definition techniques, such as photoresist trimming, are also used to reduce the feature dimensions below the prevailing photolithographic limit. Although advances in resist materials and processing methods have extended the limits of lithography, the precise formation of extremely small feature sizes remains beyond the grasp of present process technology.

An alternative approach to the formation of MOS transistor having narrow gate lengths that are not realizable with existing photolithographic techniques is disclosed in U.S. Pat. No. 6,060,377, Method for Fabricating a Polysilicon Structure With Reduced Length That Is Beyond Photolithography Limitations. The technique disclosed there is predicated on a silicidation anneal to achieve reduced gate length. A masking polysilicon structure is first formed on a hardmask layer and is then patterned by reactive ion etching (RIE). A metal layer of predetermined thickness is formed by chemical vapor deposition (CVD) over the top and contiguous to the sidewalls of the patterned masking polysilicon structure. An anneal is performed to form a metal silicide with the sidewalls of the masking polysilicon structure. The metal silicide is ultimately removed with a selective wet etch to reveal a masking polysilicon structure of reduced length. This masking polysilicon structure is then used as a mask for the formation of the gate structure of a MOS transistor.

Without unwarranted derogation of the effectiveness of the above process in the formation of MOS devices of reduced gate length, practitioners skilled in the art of semiconductor device fabrication nonetheless recognize that such a process is not particularly auspicious for its simplicity. To wit: a number of process steps, the salient one of which is a silicidation anneal, must be performed in order to acquire a polysilicon mask with the desired feature size. Additional processing subsequent to the silicidation anneal is required for the formation of the ultimate gate structure. Accordingly, a technique for achieving a reduced-gate-length MOS transistor with more favorable process efficiency and simplicity would constitute a welcome advance in the state of the art.

BRIEF DESCRIPTION OF THE DRAWING

The subject Gate Length Control by Reaction/Etch Process may be better understood by, and its many features, advantages and capabilities made apparent to, those skilled in the art with reference to the Drawings that are briefly described immediately below and attached hereto, in the several Figures of which identical reference numerals (if any) refer to identical or similar elements, and wherein.

Figure 1:
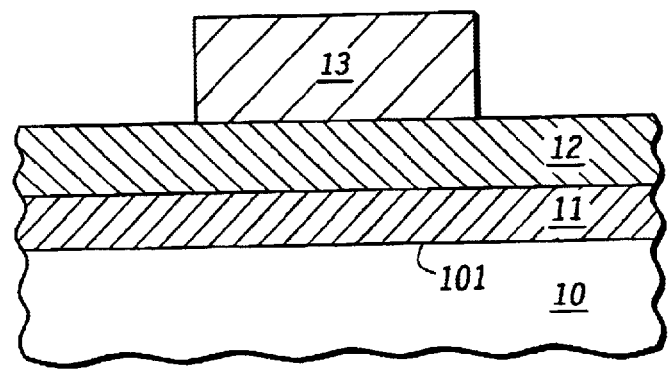
FIGS. 1 through 6 constitute a process flow schematic for the fabrication of a MOS transistor in which a gate-length reduction is realized other than by photolithographic techniques.

Skilled artisans appreciate that elements in Drawings are illustrated for simplicity and clarity and have not (unless so stated in the Description) necessarily been drawn to scale. For example, the dimensions of some elements in the Drawings may be exaggerated relative to other elements to promote and improve understanding of embodiments of the invention.

DETAILED DESCRIPTION OF PREFERRED EMBODIMENTS

For a thorough understanding of the subject invention, reference is made to the following Detailed Description, which includes the appended Claims, in connection with the above-described Drawings.

In a manner that will be made eminently clear below, the subject invention inheres, in one form, in a technique for directly achieving the ultimate length of a MOS transistor gate structure other than by a photolithographic step. The technique is particularly felicitous in fabrication processes where photolithography is unavailing, or contraindicated, as the process step for the formation of a reduced gate length. A polysilicon gate conductor layer is first formed on a metal oxide (MeOx) gate dielectric layer. The polysilicon layer is then photolithographically patterned to a first length. A metal layer is formed conformally over the patterned polysilicon. The metal is reacted with the polysilicon at a controlled temperature to form metal suicide sidewalls contiguous to the sidewalls of the patterned polysilicon. The unreacted metal and the metal silicide are etched away, resulting in a polysilicon gate conductor having a predetermined reduced length that is less than the length of the patterned polysilicon immediately subsequent to the prefatory photolithographic step.

An appreciation of the subject invention may be conveniently acquired by reference to and inspection of FIG. 1 through FIG. 6, which in the aggregate constitute pertinent aspects of the process flow schematic for the fabrication of a reduced-length gate structure.

Directing attention now to FIG. 1, in a conventional manner a semiconductor substrate 10 is provided for the formation of one or more pMOS or nMOS transistors (not shown). Inasmuch as techniques for forming active device areas in substrate 10 are well known to those skilled in the art,. those techniques are not discussed here or illustrated in the FIGs. Suffice it to say, that, in general, substrate 10 may, constitute lightly doped n-type or p-type single-crystal silicon. Subsequent to substrate doping, an n-well (not shown) may be formed in substrate 10 to accommodate a pMOS transistor, and a p-well (not shown) may be formed to accommodate an nMOS transistor. Ordinarily, in the context of a twin-well design, an n-well is selectively implanted in an area of substrate 10 where a pMOS transistor is formed. In one embodiment, the n-well may itself be enclosed within a tub (not shown) having p-type conductivity. In another embodiment, substrate 10 may include a lightly doped epitaxial layer that is formed over more heavily doped bulk silicon. That is, substrate 10 may in fact be a $P^-$ epitaxial layer formed in $P^+$ bulk silicon. As is well known, n-type conductivity areas may be formed by implantation with phosphorus or arsenic; p-type conductivity areas may be formed by implantation with boron. Substrate 10 may also assume the familiar silicon-on-insulator (SOI) form or may comprise a strained silicon layer on a Group III–VI compound. In practice, the pMOS and nMOS areas are separated by isolation structures (nut shown). Depiction and description of isolation techniques are not deemed edifying here and therefore have been omitted for the sake of brevity and clarity.

With continued reference to FIG. 1, it may be seen that a gate dielectric material 11 is formed on surface 101 of substrate 10. In a preferred embodiment, dielectric material 11 is a metal oxide (MeOx). Suitable metal oxides include oxides or oxynitrides of zirconium, hafnium, aluminum, strontium, titanium, lanthanum, praseodymium, silicon and combinations thereof. Gate dielectric material 11 may be deposited in accordance with known techniques, including by chemical vapor deposition (CVD), plasma-enhanced chemical vapor deposition (PECVD), physical vapor deposition (PVD), metal-organic chemical vapor deposition (MOCVD) or atomic layer chemical vapor deposition (ALCVD) techniques or by combinations thereof. MeOx gate dielectric materials are advantageous, inter alia, because of the relatively high dielectric constant they exhibit, thereby enabling the deposition of a thicker gate dielectric layer without adverse effects on the physical and electrical characteristics of the device. In addition, and for reasons that will presently become clear, the use of a MeOx gate dielectric is particularly suitable because of its immunity to a subsequent silicidation anneal.

Subsequent to the deposition of gate dielectric material 11, a layer of semiconductor material 12 is formed over gate dielectric material 11. Layer 12 may be amorphous or polycrystalline Si or Si,Gey, or combinations thereof. Optionally, an ARC layer (not shown) may be deposited on semiconductor layer 12 in order to obtain enhanced results in forthcoming lithographic steps. Next, a layer of photoresist 13 is imposed on semiconductor,layer 12. As illustrated in FIG. 1, photoresist layer 13 is patterned in accordance with photolithographic techniques, including masking and etching, to a predetermined dimension.

Figure 2:
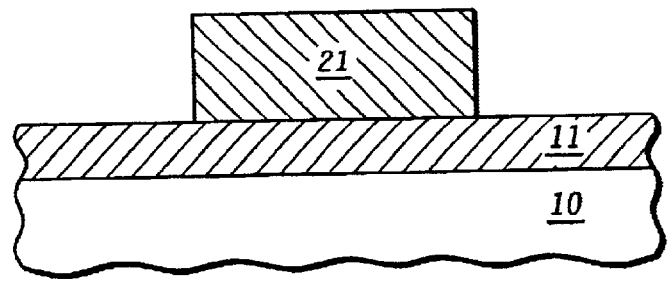

Referring now to FIG. 2, a prevenient gate conductor 21 is formed by etching away exposed portions of semiconductor layer 12 down to gate dielectric material 11. In some instances,-prevenient gate conductor 21 may be trimmed to a precise final predetermined first length.

Figure 3:
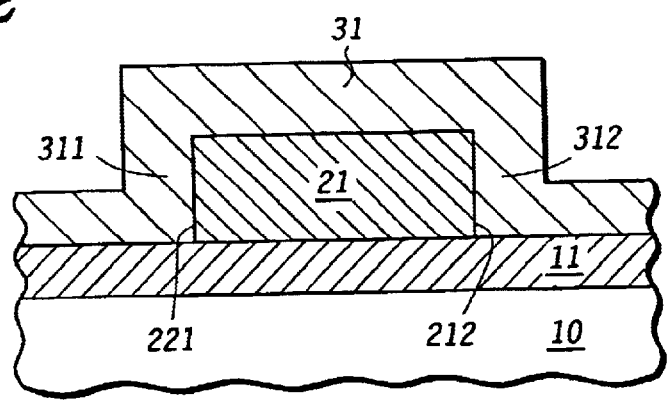

The next process step, FIG. 3, involves the deposition of a layer of metal 31. Metal layer 31 may be deposited conformally on and around prevenient gate conductor 21, as well as on exposed gate dielectric material 11, preferably to a thickness of 20 to 500 angstroms. PVD is deemed to be a preferred method of deposition for layer 31. As may be seen in FIG. 3, metal layer 31 comprises vertical sidewalls 311 and 312 that are contiguous to respective sidewalls of 211 and 212 of prevenient gate conductor 21. Sidewalls 311 and 312 also contact portions of gate dielectric material 11 that are laterally adjacent to sidewalls 211 and 212. Metal layer 31 may be cobalt (Co), titanium (Ti), nickel (Ni), tungsten (W) or any other metal or alloy that is, or is found to be, suitable in conjunction with the remaining process steps.

Figure 4:
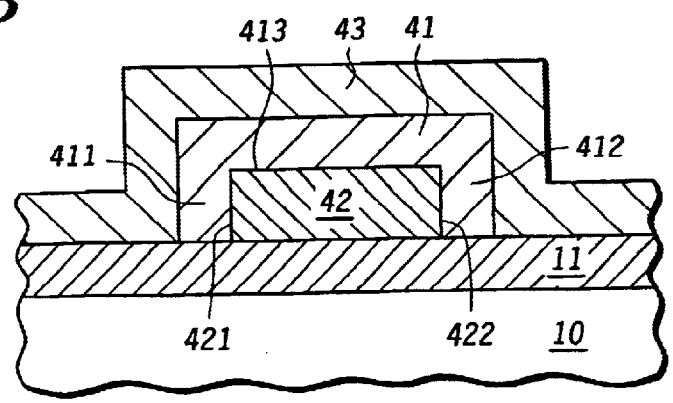

In FIG. 4, metal layer 31 is caused to react with layer 21 to form a metal silicide layer 41 of a predetermined thickness. The reaction results in metal silicide abutments 411 and 412 to sidewalls 421 and 422 of reduced gate conductor 42. An amount of unreacted metal 43 may remain after the anneal, depending on the degree to which the reaction is caused to proceed. For purposes of this Description, the general case will be assumed in which some amount of unreacted metal remains at the time the reaction is terminated. The reaction consists largely of a silicidation anneal for a predetermined time and temperature. In a preferred embodiment, the anneal is performed at a temperature of less than 500° C. for a period of less than 60 seconds. In one embodiment the silicidation reaction was found to be effective when terminated after a duration of 25 to 35 seconds. A low temperature (less than 500° C.) anneal is found to be preferable in that annealing at higher temperatures, say 700 to 900° C., can result in the formation of an oxide at the interface between substrate 10 and gate dielectric material 11, or between gate dielectric material 11 and reduced gate conductor 42. The formation of an oxide here (especially under the gate) is detrimental to device performance in that it results in an indeterminately increased gate oxide thickness. Nevertheless, the invention comprehends all forms of reactions, including annealing at higher temperatures, that result in the formation of a metal siticide layer at the sidewalls 211 and 212.

Certain of the process parameters associated with the silicidation anneal have been found to be significant in the results that are obtained. For example, there is an indication that annealing at a lower temperature for a greater duration produces a gate conductor with less edge roughness. However, an anneal temperature as low as 300° C. may require a reaction duration that is excessive when throughput considerations are heavily weighted. Conversely, an anneal at approximately 500° C. for less than 60 seconds (with 25 to 35 seconds considered typical) may be considered to represent an optimal tradeoff. Nevertheless, reactions that take place with a rapid thermal anneal (RTA), or with a laser anneal, for short durations and high temperatures (up to 1500° C., for example) are nonetheless deemed with the scope of the invention.

FIG. 4 illustrates the formation of metal silicide that resides on top surface 413 of silicon layer 42. In practice, in order for this portion of metal silicide to be formed, any antireflective coating (ARC) should first be removed from the top surface of layer 21. However, note that metal silicide will be formed on top surface only if any ARC that had been earlier deposited there is removed (by, for example, either a dry etch or a wet etch) prior to the silicidation anneal. Removal of the ARC is within the judicious discretion of the process designer. Retention of the ARC layer prevents formation of a top metal silicide layer, so that no diminution in the thickness of gate conductor 42 occurs. Removal of the ARC layer results in reduction in both the thickness as well as the length of gate conductor 42.

In accordance with a preferred embodiment of the present invention, use of a metal oxide for gate dielectric material 11 inhibits the formation of silicide with the gate dielectric layer. This would not be the case when, for example, $SiO_2$ serves as the gate dielectric material. In addition, because $SiO_2$ has a dielectric constant that is appreciably lower than the dielectric constant of a MeOx, a $SiO_2$ gate dielectric would necessarily be much thinner than a MeOx gate dielectric that presents the same capacitance. Consequently, $SiO_2$ is unacceptably vulnerable to consumption in the course of the silicidation of gate conductor 42.

Figure 5:
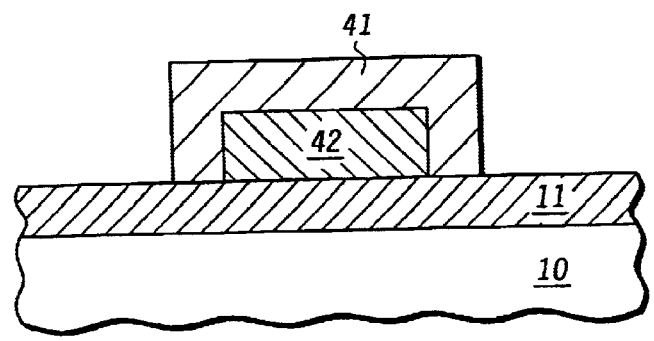

Continuing, in FIG. 5, unreacted metal 43 is removed, preferably with a wet etch, leaving metal silicide 41 and reduced gate conductor 42. The wet etch may be performed with any of a number of commercially available products and will be dependent on the specific materials used.

Figure 6:
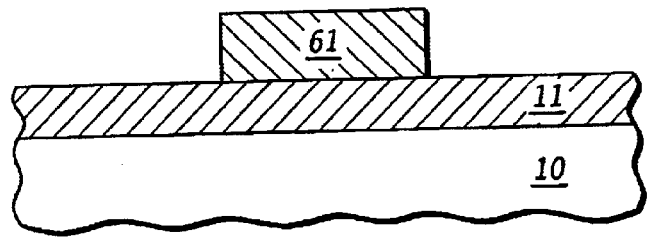

In FIG. 6, metal silicide layer 41 is removed with an etch that also does not attack the gate dielectric material 11. For example, for certain metal oxides as the gate dielectric material (especially cobalt silicide), HF may be used to etch away silicide layer 41. However, skilled practitioners appreciate the equivalence of other chemistries in this application. A subsequent etch using a mixture of NH4OH and H2O2 and deionized water (sometimes referred to in the industry as, an SC1 etch or clean) can be used to clean exposed portions of the gate dielectric material and remaining gate conductor material. The result of the silicide removal is an ultimate gate conductor 61 that has an ultimate predetermined length that is less than the length of the initially formed prevenient gate conductor 21.

After fabricating gate layer to the ultimate length dimension, subsequent processing is carried out to complete the fabrication of an MOS transistor. Source and drain regions are formed in the substrate. Additionally, source/drain extension regions may also be formed in the substrate so as to extend from source and drain regions to the vicinity of first and second edges of gate layer. Sidewall spacers are typically formed overlying first and second edges, respectively. After forming sidewall spacers, and creating doped drain and source regions, contacts are formed overlying the source and drain regions and the gate layer. Those skilled in the art sill recognize that MOS transistor incorporates many components typically found in submicron MOS transistors. Additionally, MOS transistor can be either an n-type or a p-type depending on the conductivity of the dopants used to form source and drain regions and source/drain extension regions. As described above, the gate layer can be a material doped with either p-type or n-type dopants.

It is doubtless evident that there has been disclosed herein a technique for forming a reduced-length gate conductor for a MOS transistor in a manner that circumvents the limitations of optical lithography. An example is that for current phase-shift lithography, including trimming of resist prior to etching of a gate electrode, dimensions of 35 nm are difficult to repeatably obtain. It would be easier to etch to 45 nm then use the present invention to shrink the gate length to 35 nm, 25 nm, or smaller. Thus, the process enables definition of gate lengths below 100 nanometers, a threshold at which diffraction phenomena attendant even deep UV lithography become preclusive of desired feature sizes. The process incorporates a gale dielectric layer of a material, MeOx for example, that enables gate—width reduction by silicidation and etching of a prevenient gate conductor. As a result, ultimate gate conductor is directly formed by silicidation/etching, sans any intervening steps in the nature of masking and/or etching. The time and temperature of the silicidation reaction are controllable determinants of the ultimate (reduced) gate conductor length. If the silicidation reaction is performed at or below an appropriately low temperature, approximately 500° C. in one embodiment, then no derogation of the gate dielectric results from the silicidation/etch sequence.

The subject invention has been described hereinabove largely in the context of the fabrication of a more or less conventional MOS transistor. However, it is not to be inferred that the invention is not so limited in its applicability. Other types of semiconductor devices may also benefit from a technique whereby the dimensions of a device is susceptible of reduction beyond the capabilities of photolithographic patterning.

In addition, the Description above has been presented largely in the context of the fabrication of a gate conductor for a MOS transistor. However, note that this contextual constraint has been imposed primarily for pedagogical purposes. Those skilled in the art recognize that the invention is equally applicable to the fabrication of other conductive structures for semiconductor devices.

Figure 7:
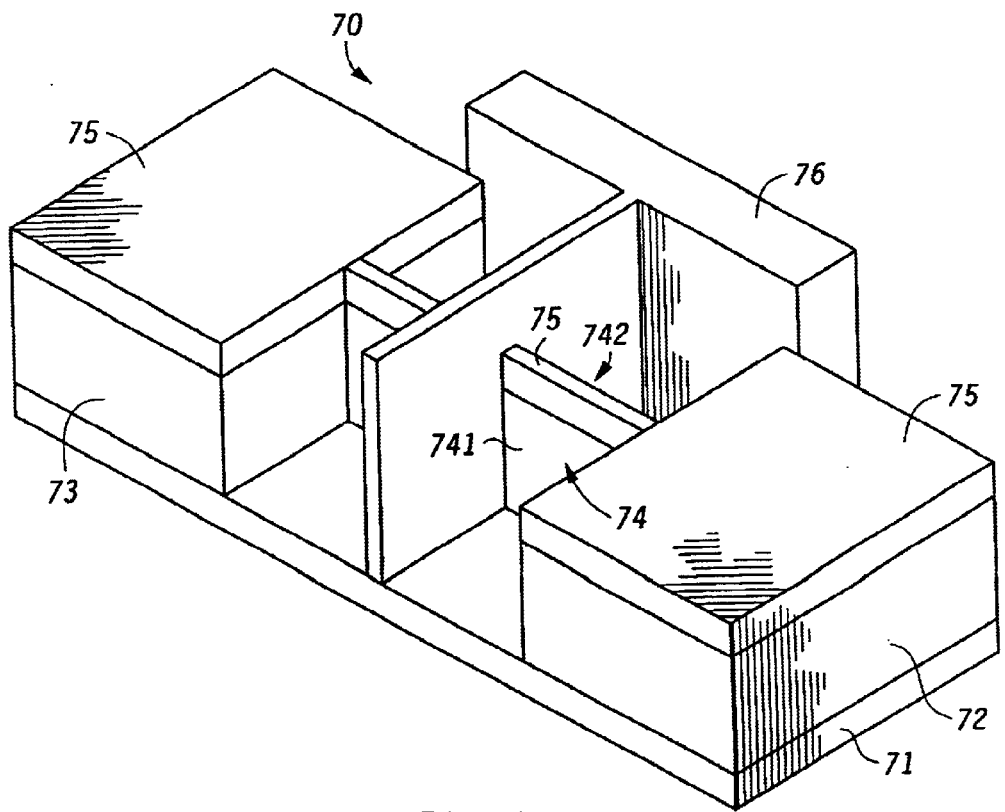
FIG. 7 is a perspective view of a FinFET device that may be fabricated in accordance with one embodiment of the invention.

Referring now to FIG. 7, a FinFET 70 is fabricated on a layer 71 of insulating matter. In one instantiation, layer 71 may be SIMOX [Silicon Implanted to form OXide) and may include a silicon drain island 72 and a silicon source island 73. Drain island 72 and source island 73 are connected by a channel 74 that assumes a form resembling a fin (hence, "FinFet"). Drain 72, source 73, and channel 74 are covered by a dielectric layer 75. Gate electrode 76 extends across channel 74 and is isolated therefrom by a gate oxide (not shown) which has been grown on the channel (including on its vertical sidewalls). Channel 74 extends horizontally along layer 71 and comprises opposing walls 741 and 742 that rise in a vertical direction from layer 71. Only frontmost wall 741 appears in FIG. 7. Gate 76 is formed in proximity to both of the opposing walls 741 and 742, and thus is referred to as a double-gate device.

The double-gate structure thereby achieved is effective to suppress shortchannel effects (SCE) and to enhance device drive current. Because of the thinness of fin channel 74, channel doping is not generally required for the suppression of SCE. In this regard, the subject dimension-reduction technique is particularly useful in reducing the thickness of channel 74 beyond that which is achievable solely by photolighography.

In one embodiment, fabrication of a FinFET with reduced channel thickness in accordance with the present invention would proceed with the formation of a drain 72, source 73 and a prevenient channel 74, all on layer 71. The prevenient channel is photolithographically formed to a predetermined first thickness. As described above, respective metal layers are deposited contiguous to sidewalls 741 and 742 of prevenient channel 74, and the metal layers are caused to react with sidewalls 741 and 742, forming metal silicide abutments at the sidewalls. Subsequently, the metal silicide abutments are removed to form a final channel that has a predetermined second thickness that is less than the first thickness.

Figure 8:
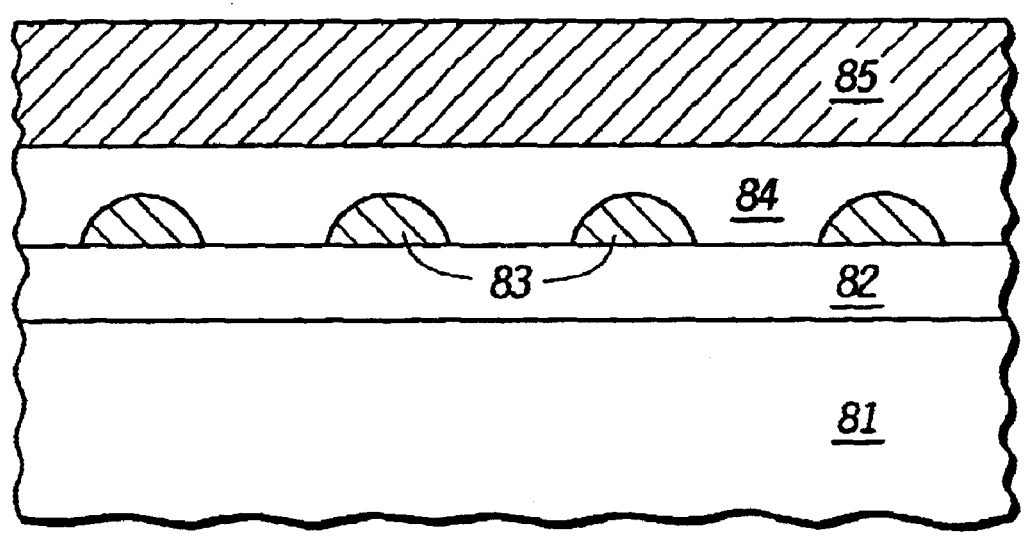
FIG. 8 is a cross-sectional view of a quantum semiconductor device that may be fabricated in accordance with one embodiment of the invention.

Similarly, the dimension reduction technique described herein is applicable to the fabrication of semiconductor quantum dots. As is known to those skilled in the art, quantum dots are fabricated by the deposition of a semiconductor material on an appropriate substrate. Deposition is directed at discreet sites on the substrate so that a small number (say, 100 to 1,000 or so) of atoms nucleate at each site. In an application for memory devices, as shown in FIG. 8, these dots 83 can be formed upon an existing dielectric layer 82, then capped with an additional dielectric layer 84 and an electrode 85. By applying a bias upon the top electrode 85, charge is extracted from the substrate 81, through the dielectric layer 82, and gets trapped in the dots 83. The dots then act as a memory storage device.

Depending on the specific deposition growth conditions, the geometry of the "dots" may be spherical, hemispherical, disc-like, or such. Whatever form the deposited dots take, deposition will be permitted to proceed to a predetermined first dimension, (assume diameter) that is greater than the desired predetermined final diameter. In accordance with another embodiment of the present invention, a metal layer may be deposited on the dots, and the metal is then reacted with the dots (e.g. through an anneal process) to form a cortical metal silicide layer. Unreacted metal is removed, as is the resulting metal silicide layer on each of the dots. The result is a quantum dot that has a predetermined final diameter that is less than the diameter of the prevenient dot.

It is also noted that approaches other than silicidation anneal may be pursued in order to realize feature sizes below that which is lithographically practicable. For example, $NH_3$ may be used to form $Si_3N_4$ abutments at sidewalls 421 and 422. The $Si_3N_4$ abutments may then be removed with an appropriate selective etch.

In the Description above, the invention has been set forth in the context of specific numerous embodiments, in a manner that is intended to be illustrative and to convey a thorough comprehension of the invention. However, one of ordinary skill in the art pertaining to the design and fabrication of semiconductor devices will appreciate that various modifications and changes may be imparted to the specifically described embodiments without departure from the scope of the invention. Consequently, the invention is to be understood as embracing all subject matter included within the literal scope of the appended Claims, as well as equivalents thereof. For example, the invention is not to be construed as limited to the specific materials and thicknesses identified herein. Similarly, those skilled in the art understand that conductivity types (P-type, N-type) and carrier types (holes, electrons) may, in general, be reversed, provided that requisite consistency is preserved. Accordingly, the Description and the Figures are properly construed are illustrative of the invention, rather than delimiting, and all modifications to or departures from them are consequently comprehended by the scope of the subject invention.

Similarly, benefits, advantages, capabilities and solutions to operational or other technical challenges have been enumerated with respect to the specific embodiments of the invention, as provided herein. However, the benefits, advantages, capabilities and solutions, and any elements(s) or limitation(s) that give rise to any such benefit, advantage, capability and solution, or that enable or cause the same to become more pronounced, are not to be considered or construed as a critical, required, or essential element or limitation of any or all of the Claims, either expressly or by implication or estoppel. Furthermore, as used herein, the terms "comprises," "comprising," or any variation thereof, are intended to apply nonexclusively, so that a process, method, article or apparatus that comprises a recited enumeration of elements includes not only recited elements but also other elements not explicitly recited or enumerated but inherent to such process, method, article, or apparatus.

We claim:

1. A method of forming a gate structure, the method comprising:

forming a gate dielectric layer on a semiconductor substrate;

forming a gate conductor layer on the gate dielectric layer, the gate conductor layer comprising a semiconductor material;

patterning the gate conductor layer so that the gate conductor layer has a first length;

forming a metal layer on at least sidewalls of the patterned gate conductor layer and on at least portions of the gate dielectric layer;

reacting the metal layer with the patterned gate conductor layer to form a metal silicide layer;

etching away unreacted metal; and etching away the metal silicide layer so as to form a resulting gate conductor having a reduced length that is less than the first length.

2. A method of forming a gate structure as defined in claim 1, wherein the gate dielectric is a metal oxide.

3. A method of forming a gate conductor as defined in claim 1 wherein forming a metal layer comprises forming a metal layer comprised of a metal selected from the group consisting of Co, Ni, Ti, Pd or Pt.

4. A method of forming a gate conductor as defined in claim 1, wherein etching away the metal silicide is performed using a wet etch.

5. A method of forming a gate conductor as defined in claim 4, wherein etching away the metal silicide is performed by an HF dip.

6. A method of forming a gate structure as defined in claim 1, wherein the gate conductor layer has a resulting length of approximately 100 to 500 angstroms.

7. A method of forming a gate structure as defined in claim 6, wherein the metal layer is formed to a thickness of approximately 100 angstroms.

8. A method of forming a gate structure as defined in claim 1, wherein the gate conductor layer comprises Si.

9. A method of forming a gate structure as defined in claim 1, wherein the gate conductor layer comprises $Si_xGe_y$.

10. A method of forming a conductive structure for a MOS transistor, the method comprising:

forming a metal oxide dielectric layer on a substrate;

forming a conductor layer on the dielectric layer, the conductor layer comprising silicon;

patterning the conductor layer to form a prevenient conductor of a predetermined first length;

depositing a metal layer on at least portions of the gate dielectric layer and around the prevenient conductor;

causing the metal layer to react with the prevenient conductor so as to form a metal silicide abutments along sidewalls of the prevenient conductor;

removing unreacted metal; and removing the metal silicide abutments so as to provide a final conductor of a predetermined second length, wherein the second length is less than the first length.

11. A method of forming a conductive structure for a MOS transistor as defined in claim 10, further comprising:

removing portions of the dielectric layer that are not covered by the conductor.

12. A method of forming a conductive structure for a MOS transistor as defined in claim 10, wherein the metal layer is caused to react with the prevenient conductor by heating.

13. A method of forming a conductive structure for a MOS transistor as defined in claim 12, wherein heating takes place at less than approximately 500° C.

14. A method of forming a conductive structure for a MOS transistor as defined in claim 10, wherein the prevenient conductor is either Si or $Si_xGe_y$.

15. A method of forming a conductive structure for a MOS transistor as defined in claim 10, wherein the metal is Co.

16. A method of forming a conductive structure for a MOS transistor as defined in claim 10, wherein the metal silicide abutments are removed in a manner that does not significantly affect the dielectric layer.

17. A method of forming a conductive structure for a MOS transistor as defined in claim 16, wherein the metal silicide abutments are removed by etching with HF.

18. A method of forming a conductive structure for a MOS transistor as defined in claim 10, further comprising:

forming an ARC on the conductor layer prior to patterning the conductor layer.

19. A method of forming a conductive structure for a MOS transistor as defined in claim 18, further comprising:

removing the ARC from the prevenient conductive layer prior to deposition of the metal layer so that the final conductor has a thickness that is less than the prevenient conductor.

20. A method of forming a conductive structure for a MOS transistor as defined in claim 18, further comprising:

preserving the ARC on the prevenient conductor prior to depostion of the metal layer so that the final conductor has a thickness that is substantially equal to the prevenient conductor.

21. A method for fabricating an electronic structure comprising:

providing a semiconductor substrate;

forming a dielectric layer over the semiconductor substrate;

forming a semiconductor structure comprised of silicon over the dielectric layer, the semiconductor structure having an as-formed dimension;

depositing a metal layer on the semiconductor structure;

reacting the metal layer with silicon of the semiconductor structure to form metal silicide;

removing unreacted portions of the metal layer;

selectively etching the metal silicide such that the semiconductor structure has a resulting dimensions which is less than the as-formed dimension.

22. The method of claim 21 wherein the semiconductor structure comprises a plurality of quantum dots.

23. The method of claim 21 wherein the semiconductor structure is a channel region of a FinFET.

24. The method of claim 21 wherein the semiconductor structure is gate of a transistor.

* * * * *

UNITED STATES PATENT AND TRADEMARK OFFICE
CERTIFICATE OF CORRECTION

PATENT NO. : 6,849,487 B2
DATED : February 1, 2005
INVENTOR(S) : William J. Taylor, Jr. et al.

It is certified that error appears in the above-identified patent and that said Letters Patent is hereby corrected as shown below:

<u>Column 9,</u>
Line 16, change "$Si_x,Ge_y$" to -- $Si_xGe_y$ --.

<u>Column 10,</u>
Line 34, change "having an as-formed dimension; to -- having a first dimension; --.
Line 41, change "resulting dimensions" to -- second dimension --.
Line 42, change "as formed" to -- first --.

Signed and Sealed this

Second Day of May, 2006

JON W. DUDAS
*Director of the United States Patent and Trademark Office*